(12) United States Patent
Yu et al.

(10) Patent No.: US 8,493,776 B1
(45) Date of Patent: Jul. 23, 2013

(54) MRAM WITH CURRENT-BASED SELF-REFERENCED READ OPERATIONS

(75) Inventors: Hung-Chang Yu, Hsin-Chu (TW); Kai-Chun Lin, Hsin-Chu (TW); Yu-Der Chih, Hsin-Chu (TW); Chun-Jung Lin, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 13/364,756

(22) Filed: Feb. 2, 2012

(51) Int. Cl.
*G11C 11/00* (2006.01)

(52) U.S. Cl.
USPC .......................................... 365/158

(58) Field of Classification Search
USPC ........................................... 365/158
See application file for complete search history.

(56) References Cited

U.S. PATENT DOCUMENTS

| | | | | |
|---|---|---|---|---|
| 7,635,993 B2 * | 12/2009 | Boeve | ............................ | 326/136 |
| 7,813,168 B2 | 10/2010 | Zhu et al. | | |
| 7,876,604 B2 | 1/2011 | Zheng et al. | | |
| 7,911,832 B2 * | 3/2011 | Kent et al. | ...................... | 365/171 |
| 8,045,370 B2 | 10/2011 | Zhu et al. | | |

OTHER PUBLICATIONS

Kawahara, T. et al., "SPRAM (SPin-transfer torque RAM) design and its impact on digital systems", 14th IEEE International Conference on Electronics, Circuits and Systems, ICECS, Dec. 2007, pp. 1011-1014.
Kawahara, T. et al., "2 Mb SPRAM (SPin-Transfer Torque RAM) With Bit-by-Bit Bi-Directional Current Write and Parallelizing-Direction Current Read", IEEE Journal of Solid-State Circuits, Jan. 2008, 43(1):109-120.
Kim, T.Y. et al., "A 75 MHz MRAM with Pipe-Lined Self-Reference Read Scheme for Mobile/Robotics Memory System", Asian Solid-State Circuits Conference, 2005, pp. 117-120.

* cited by examiner

*Primary Examiner* — Hoai V Ho
*Assistant Examiner* — Pablo Huerta
(74) *Attorney, Agent, or Firm* — Duane Morris LLP

(57) ABSTRACT

A magnetoresistive memory stores logic values in high and low resistance states of magnetic tunnel junction elements. Instead of comparing the resistance of elements to a fixed threshold to discern a logic state, the resistances of elements are self-compared before and after imposing a low resistance state. A measure of the resistance of an element in its unknown resistance state is stored, for example by charging a capacitor to a voltage produced when read current bias is applied. Then the element is written into its low resistance state and read current bias is applied again to develop another voltage, representing the low resistance state. A comparison circuit using current summing and an offset providing a minimum difference tolerance determines whether the resistance of the element was changed or remained the same. This determines the logic state of the element.

18 Claims, 11 Drawing Sheets

MRAM WITH CURRENT-BASED SELF-REFERENCED READ OPERATIONS

BACKGROUND

This disclosure relates to MRAM integrated circuit memories wherein different logic values are represented by changeable states of high or low electrical resistance in one or more magneto-resistive memory elements contained in bit cells. For reading out the logic value stored in a cell as herein disclosed, a current level first is established representing the present logic state of the cell. A low resistance state is then imposed on the cell, and a self-reference current comparison circuit establishes whether the resistance state was high prior to imposition of the low resistance state, or unchanged.

A spin-transfer torque magnetoresistive random access memory (STT-MRAM) stores data values in magnetic tunnel junction memory elements. A magnetic tunnel junction or "MTJ" has superimposed magnetic layers separated by a nonmagnetic conductive film. The magnetic layers have magnetic fields that assume one of two alignments wherein the series electrical resistances through the superimposed layers and the film are distinctly different. The magnetic fields of the superimposed layers may be aligned in the same direction (parallel with one another) in a low resistance state or directly opposite (anti-parallel) in a high resistance state.

During read operations, the resistance of a cell is sensed and compared in some way to a threshold that distinguishes between high resistance and low resistance states. For example, a voltage can be generated by passing a read current of a known amplitude through the MTJ element. The voltage across the MTJ element needs to be compared against a voltage reference, in a threshold comparison circuit or the like, to distinguish between high and low resistance states. It is also possible to apply a known voltage and to compare the resulting current to a current threshold. Whether in voltage or current, the relatively higher and lower resistance states of the MTJ elements represent logical 'zero' or 'one' binary values of a bit cell.

A change of the logical value of a bit cell having an MTJ element is accomplished by changing the alignment of the magnetic field of the free layer relative to the alignment of the pinned layer. A spin-transfer torque (STT) cell is advantageous in that the alignment of the magnetic field in the free layer can be changed simply by passing an appropriate write current through the magnetic tunnel junction MTJ element. Reading the value of a bit, namely detecting its resistance state, also involves passing a current through the MTJ element. The read current bias level is a lower current amplitude than the write current amplitude, so as to reduce the risk of changing or "disturbing" the logical value stored at the bit cell. A read disturb error can arise in situations where there is a particular combination of resistance state and read current bias. The read current polarity and also the read current amplitude make a difference because changing an MTJ element from its high resistance state to its low resistance state requires a write current polarity that is opposite from the polarity needed when writing from a low resistance state to a high resistance state.

For write operations, a high resistance state (with anti-parallel magnetic fields) or a low resistance state (with parallel magnetic fields) can be imposed on the MTJ. The respective states are imposed using write currents of sufficient amplitude and at one of two opposite write current polarities. In either of these states, the MTJ remains stable without application of electrical power.

A bit cell operating as a logic value storage element has at least one MTJ and may have more than one MTJ. An MTJ has two magnetic plates or layers separated by a thin nonmagnetic insulating layer, for example of magnesium oxide (MgO). One of the two magnetic plates has a permanently aligned magnetic field and serves as a reference layer (the so-called pinned layer). The other magnetic plate is changeable as to its magnetic field alignment (the free layer). When the magnetic field alignment of the free layer is parallel to the field alignment of the pinned layer, the MTJ resistance is relatively lower ($R_L$), and when the field alignment of the free layer is opposite (anti-parallel) to that of the pinned layer, the MTJ resistance is relatively higher ($R_H$). The resistances may be on the order of hundreds of ohms, for example. The difference in resistance between the $R_L$ and $R_H$ states can be substantial, e.g., a difference in resistance of 100%. However the absolute resistance values in the high and low resistance states (particularly the $R_H$ value) and the ratio of resistances $R_L/R_H$ or $R_H/R_L$ can vary over the population of MTJ elements, due to variations in the dimensions of the magnetic plates and the nonmagnetic insulating layer. Such variations occur from one integrated circuit memory to another, and also from one cell to another on a same integrated circuit memory. These variations, particularly when added to inherent variations, such as the differences in resistance of different conductive paths, noise and the like, cause uncertainties in the extent to which the state of resistance of an MTJ element ($R_L$ or $R_H$) can be discerned in an uncomplicated way, such as by direct comparison against a reference value.

A challenge is presented in how best to distinguish between the higher and lower resistance states, given that the integrated circuit memory may comprise many thousands of MTJ elements with individual high and low resistance values distributed over a statistical population of high and low resistances. The issue is what value to use for the reference during threshold comparison. Manufacturing variations produce variations in high and/or low resistances among the population of memory elements in a given memory chip and also from one memory chip to another. Differences in the levels of high resistance and low resistance of MTJ elements on a chip can complicate and sometimes defeat efforts to distinguish between the high and low resistance state of a particular MTJ element.

A fixed reference might be used for threshold comparison. Although the variable aspect of the MTJ element is resistance, considering Ohm's law, the basis for comparison of resistance might involve a parameter such as voltage level or current amplitude. Alternatively, another parameter may be used that varies as a result of a resistance, voltage or current, such as a time related variable associated with charging or discharging through a resistance. In any event, for dependable results of a comparison, the reference value used as the threshold to distinguish between logic values (and resistance states) should fall at an intermediate point that is well spaced from the high and low values of the corresponding parameter of the MTJ that is being read, in its respective high and low resistance states. If the threshold is near to the high or low parameter value, it is conceivable under some scenarios that the comparison may fail to produce the correct result, namely to distinguish between the parallel and anti-parallel field alignment states of the MTJ element. A bit cell in the memory could become incapable of reading out one of the two MTJ states if the threshold happens to be higher than the high parameter value or lower than the low parameter value of that bit cell.

The statistical distribution of high resistance values $R_H$ and low resistance values $R_L$ may be such that there is a clear difference in the mean or average high resistance and the mean or average low resistance. However, there may be occurrences of outliers in the population, having $R_H$ high resistances for some MTJ elements that are in fact lower than the $R_L$ low resistances of some other MTJ elements. In that case, it is not possible to choose a fixed comparison threshold, such as halfway between the high and low means or averages, that will be effective to distinguish the high and low resistance states of all the MTJ element in an array or on a circuit chip. In such a device when using a direct comparison and a fixed threshold, some of the MTJ elements will be found to be defective because bit values written to the bit cells containing the MTJ elements cannot be read out again accurately.

Although an array or circuit chip has MTJ elements with $R_H$ and $R_L$ distributions that may overlap at the outliers, MTJ elements that have a relatively high or relative low $R_H$ in the distribution of $R_H$ values, typically also have a relatively high or low $R_L$ in the $R_L$ distribution. The $R_H$ and $R_L$ levels track one another. Neither the ratio of TMR=(RH−RL)/RL nor the ratio of RH/RL are generally constant. Generally, the TMR is between one and two, but there is variation. The RH levels typically have a wider distribution than the $R_L$ levels, perhaps because the $R_H$ level is more sensitive to variations in the thickness of the conductive layer between the magnetic layers, for example with minor manufacturing variations. Efforts are made to contend with these and other variations in hope to improve the dependability of a comparison circuit to discern the $R_H$ and $R_L$ levels of MTJ elements, namely to provide a way in which a high majority of the MTJ elements are dependably readable when in their $R_H$ and $R_L$ states. But challenges arise due to the variation in $R_H$ and $R_L$ over the population and the fact that the statistical distributions of resistances $R_H$ and $R_L$ overlap one another.

Techniques can include providing multiple MTJ elements in each bit cell, such as adjacent MTJ elements in an array, keeping the two MTJ elements always in opposite resistance states (in which case, the order of $R_H$−$R_L$ or $R_L$−$R_H$ may represent a logic value); and comparing them against one another or against an average of their resistances to discern a logic value of the bit cell. Another technique can include averaging multiple $R_H$ and/or $R_L$ values of MTJ elements, for example in a local neighborhood, and using the average(s) in some way to arrive at a comparison threshold that may be caused to vary when reading different MTJ elements in an array, or to vary from one integrated circuit MRAM chip to another.

Although $R_H$ and $R_L$ resistance values may vary and their distributions may overlap, for any given MTJ element, the resistance $R_H$ of that given element is dependably greater than the resistance $R_L$ of that same element. This characteristic of MTJ elements suggests that it may be possible to provide a self-reference that defines a comparison threshold that is between the $R_H$ and $R_L$ resistances of the MTJ element that is being read. If the present resistance value of an MTJ element is compared against a threshold equal to the average of the $R_H$ and $R_L$ resistances of the same element, a dependable read operation should be possible so long as that MTJ element has a minimal difference between $R_H$ and $R_L$. But in order to practice that technique, it is necessary to know or readily determine the average of $R_H$ and $R_L$ for all of the MTJ elements in the array, for use as individual threshold comparison values when respective elements are addressed and read.

A possible self-reference reading technique could involve taking and storing a parameter value related to the resistance level of an MTJ element in a bit cell, so as to store a measure of the unknown present state of the MTJ element. Then in a read operation, after imposing a known state on the MTJ element, one might seek to determine whether and how the resistance changed (up or down or not at all) and make a conclusion as to whether the unknown initial state was $R_H$ or $R_L$ before the read operation. After the process, the now-determined initial state may need to be written back into the MTJ element (unless the store and change steps left the MTJ element in its same initial state) so that reading the contents of the memory does not change the values stored.

It is generally necessary to impose both states on the MTJ element at successive times, so as to determine both $R_H$ and $R_L$ for that MTJ element, arriving at an average for use as the threshold comparison value that results in a decision whether the unknown initial state was $R_H$ or $R_L$. Otherwise, one might conclude erroneously that the $R_H$ or $R_L$ state of the MTJ element had changed, when in fact there were two successive measurements in the same state of $R_H$ or $R_L$, but the measurements were unequal by a small amount less than the difference between $R_H$ and $R_L$ of that MTJ element.

Such a self-reference operation requires one or more sample and hold amplifiers, one or more comparators, control gates and registers. The circuit could operate, for example, under the control of a phase counter to advance through necessary steps. The steps or phases include to bias the MTJ with a read current, to read and store a voltage representing the unknown initial state, to impose two further sequences of write current, either of which might change the MTJ state depending on its unknown initial state, in each case storing a voltage representing the $R_H$ and $R_L$ states, averaging the higher and lower voltages representing the $R_H$ and $R_L$ resistance values to provide a reference for comparison, comparing the voltage representing the unknown initial value against the reference for comparison so as to determine that initial state was $R_H$ or $R_L$, and writing back the initial state if the final state of the MTJ is not the same as the initial state.

The present value of an MTJ element ($R_H$ or $R_L$) is arbitrary and unknown. If it is known at least that the value has changed, it would be possible to store only the previous value and to determine whether the present value is higher or lower. But if the data or logic values read and written to the MTJ element are arbitrary, one cannot know anything about the former and present values in that way.

In write operations, the $R_H$ or $R_L$ state is imposed on an MTJ element by applying a write current of a required polarity and more than an minimum amplitude. Opposite polarity currents impose the opposite $R_H$ and $R_L$ states, respectively. In an exemplary self-reference technique (see U.S. Pat. No. 7,876,604—Zheng), a read current bias is applied to an MTJ element whose $R_H$ or $R_L$ state at first is unknown. The read current has the same polarity as a write current and would force the MTJ into one of the $R_H$ and $R_L$ states if the amplitude was sufficient. But the amplitude initially is kept at a predetermined current polarity below the minimum amplitude considered necessary to force a change in state. After measuring the value of a parameter related to resistance (e.g., voltage at a given current bias level), the current bias amplitude is increased beyond the minimum necessary to write or impose one of the $R_H$ or $R_L$ states onto the MTJ element. If the MTJ element was initially in the same state that is being imposed, the parameter related to resistance returns to its measured value when returning to the lower read current amplitude. If the MTJ element was not in the imposed state, the parameter related to resistance is higher or lower than its measured value when returning to the lower read current amplitude. One can then conclude whether the initial state was $R_H$ or $R_L$. If necessary, the initial state is re-imposed onto the MTJ element.

What is needed is a way to distinguish dependably between the $R_H$ and $R_L$ states of bit cells and MTJ elements in bit cells, when there are ranges of different $R_H$ and $R_L$ resistances for the MTJ elements in an array of thousands of elements and the ranges may overlap such that the $R_H$ of some MTJ elements is lower than the $R_L$ of some other MTJ elements, and further considering that the initial resistance state and/or bit cell logic value is arbitrary and unknown, meaning that any given cell might be found in a high or low resistance state.

SUMMARY

It is an object of the present disclosure to provide an effective STT-MRAM read method and circuit that embodies a self-reference technique substantially based on current, as an effective technique to avoid complications that are otherwise inherent in a population of magnetic tunnel junction (MTJ) elements.

Each logical bit can be represented by the high-or-low resistance state of a single magnetic tunnel junction (MTJ) element. In another example, a logical value can be represented by the opposite high and low resistance states of two paired magnetic tunnel junctions operated so as to assume complementary resistance states, and having resistances that can be compared against one another. Whenever one is in a high resistance state, the other is in a low resistance state, and when writing a new logical value to the cell, both junctions are changed to their opposite states.

An array of magneto resistive memory bit cells that uses changeable high and low resistance states in one or more magnetic tunnel junction elements to store logic values, is arranged to provide for an improved capability to distinguish high and low resistance states, by using self-reference techniques. The population of MTJ elements may include distributions of $R_H$ resistances and $R_L$ resistances that actually overlap, i.e., the $R_H$ resistances of some members of the population can be less than the $R_L$ resistance of other members. However for any one MTJ element, $R_H > R_L$, which fact is exploited by the techniques disclosed.

A self-reference technique requires a succession of operations or steps to compare the unknown initial state to one or more subsequent states that are imposed and therefore are known. A parameter value is developed with a measure that varies with the series resistance of an MTJ element whose resistance state is to be read when in an unknown resistance state $R_L$ or $R_H$ due to the parallel or anti-parallel alignment of the magnetic fields in the free and pinned layers of the magnetic tunnel junction (MTJ) element. That parameter and measured value are established or stored briefly, and represent the unknown initial state of an MTJ element to be read.

According to exemplary embodiments, the parameter is a current value or is processed in the circuit to provide a current value. In a subsequent step, a known resistance state is imposed on the MTJ element. The corresponding value of the parameter in the imposed state is coupled for comparison against the parameter and value representing the initial state. In exemplary embodiments, the imposed state is the low resistance $R_L$ state, obtained by imposing parallel magnetic field alignments of the pinned and free magnetic layers, which typically have a tight distribution. The parameter representing the imposed $R_L$ state comprises current and is summed at opposite polarities with the current representing the unknown state. The summed currents represent a direct comparison representing whether the initial resistance state of the MTJ element was or was not a higher resistance than the imposed low resistance $R_L$ state.

According to certain embodiments, the current comparison summing arrangement is biased such that the comparison is not wholly direct. The comparison requires a minimum difference in current to conclude that the initial state was a high resistance state. The difference in resistance before and after imposing state $R_L$, must exceed the minimum difference before the comparison circuit concludes that the initial resistance state was the high resistance state $R_H$. In embodiments wherein mean $R_L$ and $R_H$ resistances are approximately 100 and 250Ω, a minimum difference of about 50Ω, for example, effectively prevents a trivial difference in current between two successive readings in the same $R_L$ state (e.g., in the case of an initial resistance of $R_L$ and an imposed resistance of a trivially lower $R_L$), from being erroneously interpreted as an indication that the initial resistance state was $R_H$. At the same time, the use of $R_H$ and $R_L$ levels as self-reference comparison values, is highly effective.

Additional objects and aspects of this disclosure will become evident from the following discussion of exemplary embodiments.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a schematic diagram showing a self-referenced read circuit for determining the resistance state of a magnetic terminal junction (MTJ) element in a magneto resistive random access memory (MRAM).

Figure 5:
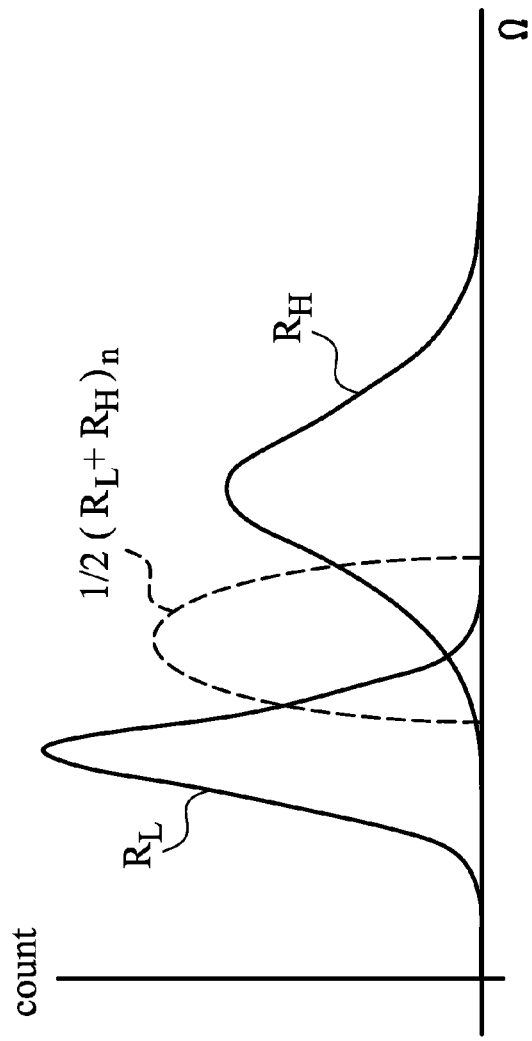

FIG. 5 is a histogram showing the distribution of $R_L$ and $R_H$ resistances on an exemplary chip, the dashed line showing a distribution of possible threshold comparison resistances that could be used if a circuit can be arranged to use an average of the $R_L$ and $R_H$ resistance of a given MTJ as the reference for distinguishing whether the MTJ is in a high resistance state ($R_H$, anti-parallel field alignments) or a low resistance state ($R_L$, parallel field alignments).

Figure 6:
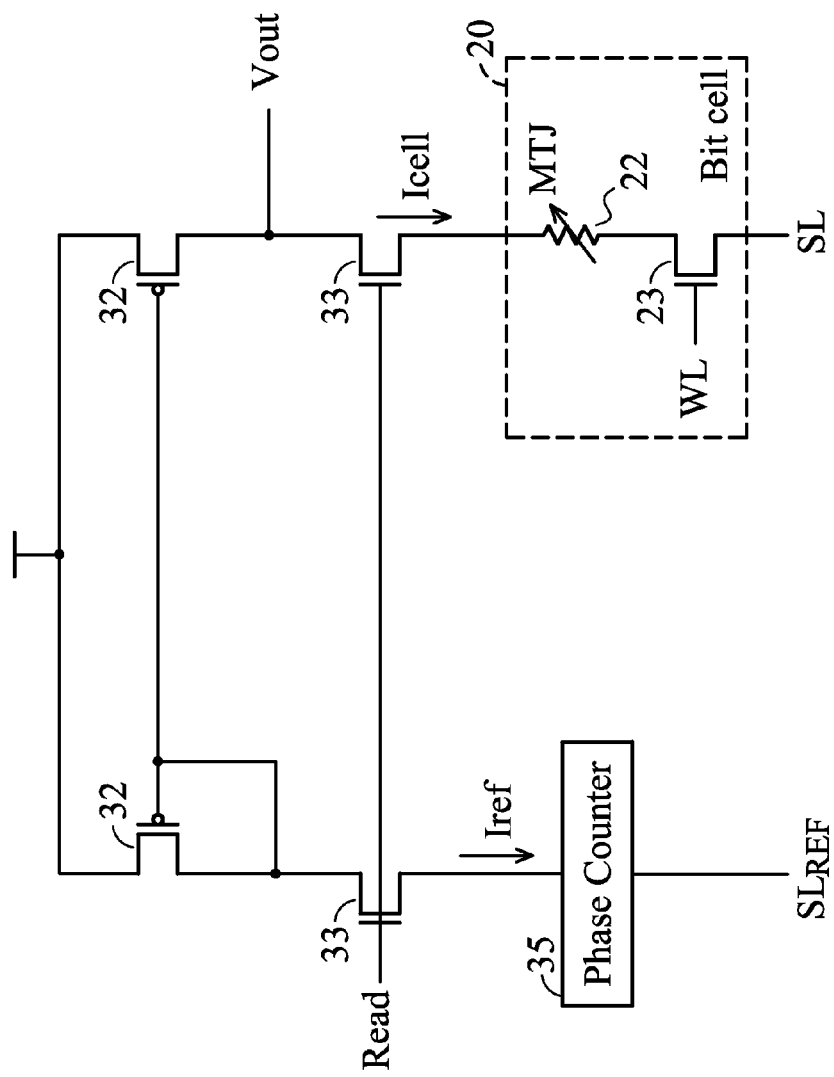

FIG. 6, labeled prior art, shows a comparison technique wherein the resistance of an MTJ element is compared to the resistance of a reference cell.

Figure 7:
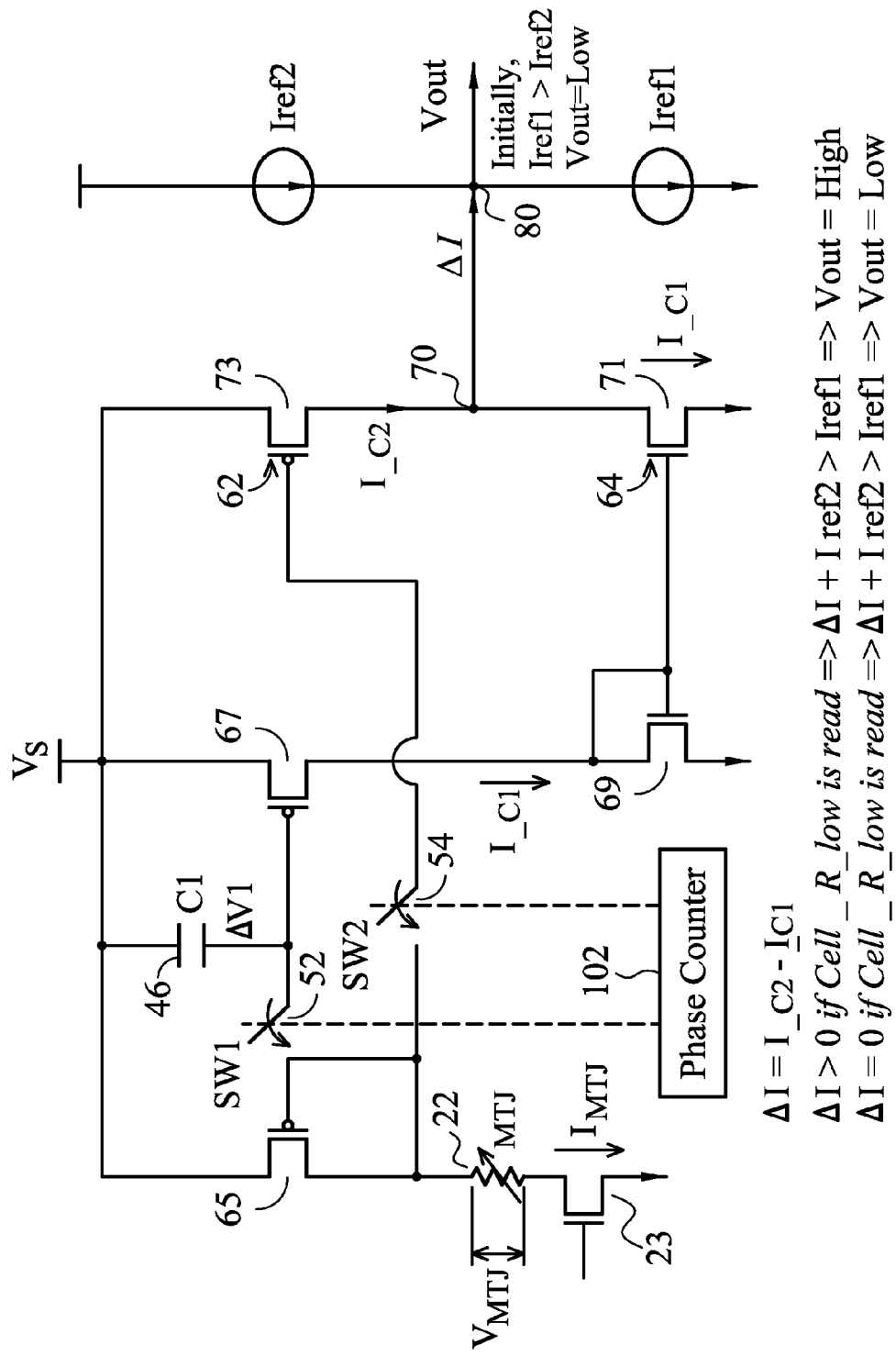

FIG. 7 is a schematic diagram of an embodiment of a self-reference comparison circuit configured to compare current levels in an MTJ element in a present-unknown resistance state and after imposing a known resistance state.

Figure 8:
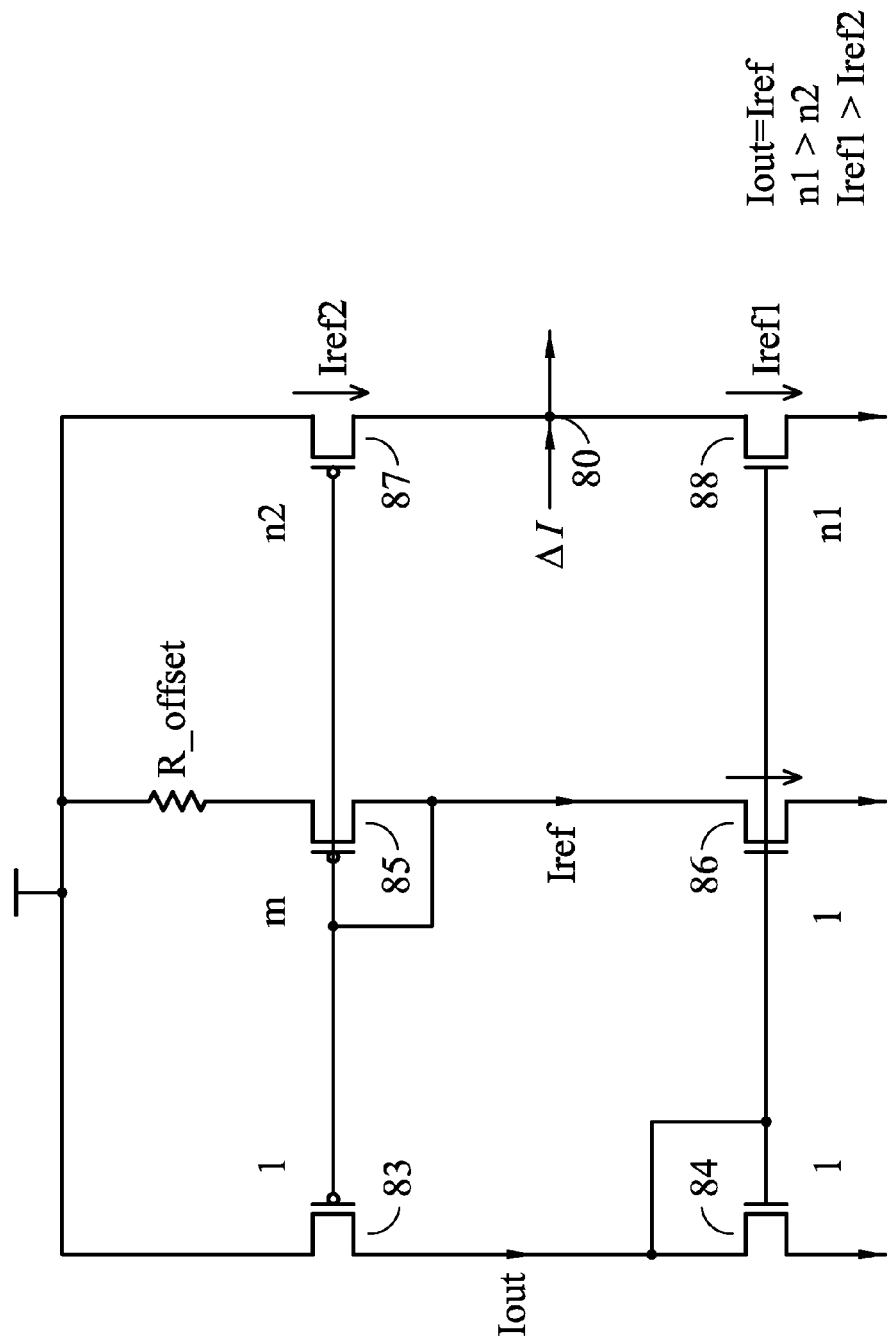

FIG. 8 is a schematic illustration showing a source of two reference currents that functions as a current comparator, and is balanced and un-balanced according to a current output of the circuit in FIG. 7. The reference current source has a bias or offset that determines the sensitivity of the comparator to a difference between current levels before and after imposing the known resistance state. The difference must exceed the bias or offset, before the comparator output signals that the imposed resistance state is different (lower) than the unknown resistance state prior to imposing the known resistance state.

Figure 9:
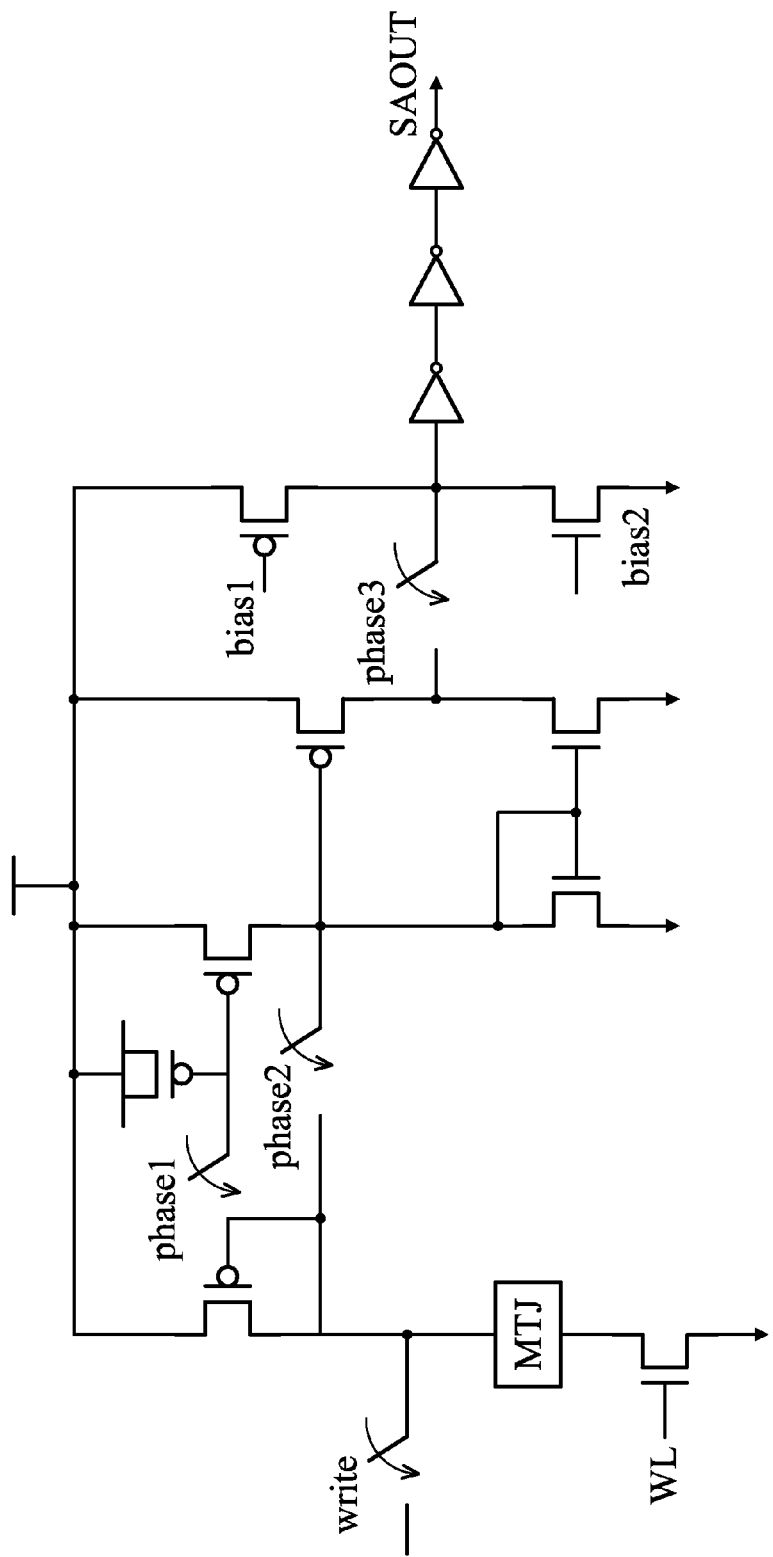

FIG. 9 is a schematic diagram showing a practical implementation of the circuits shown schematically in FIGS. 7 and 8.

Figure 10:
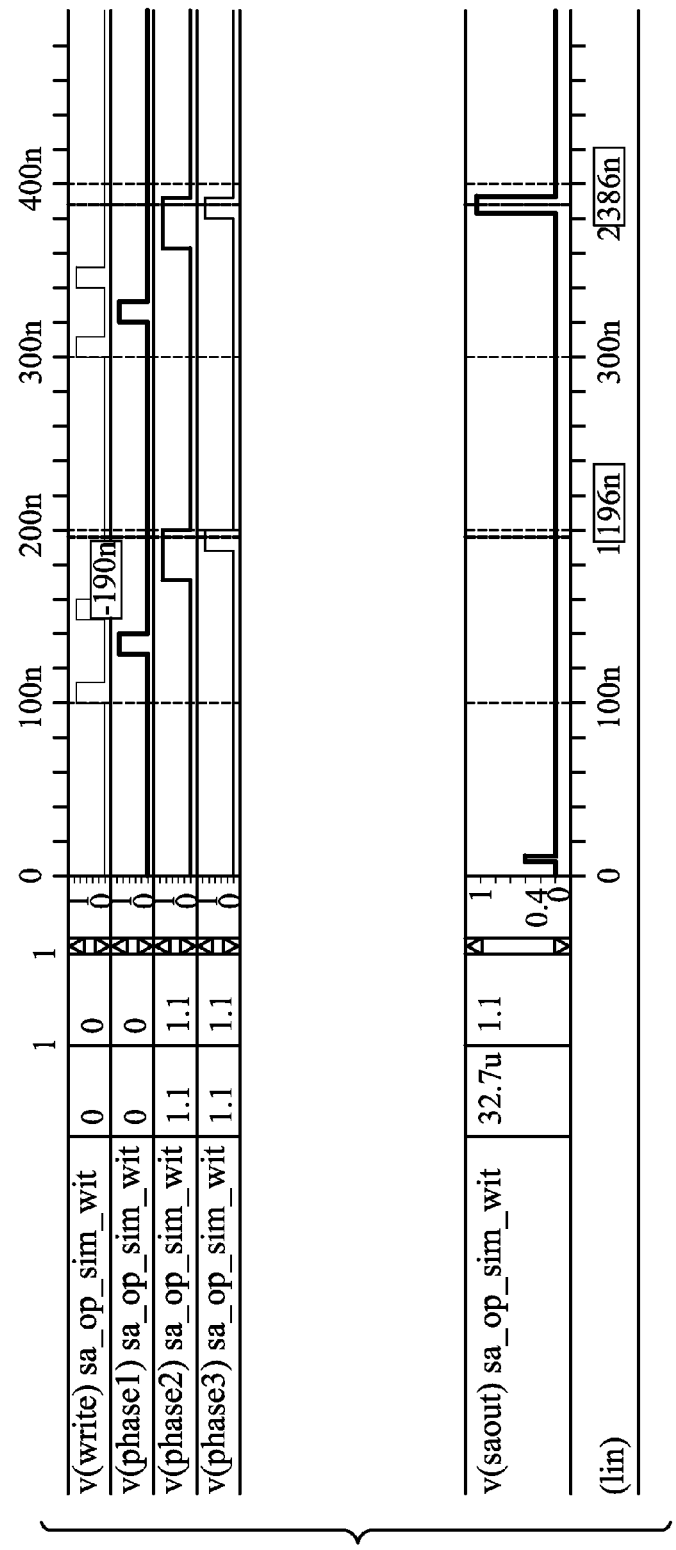

FIG. 10 is a timing diagram showing clocking phase signals coupled to the circuit of FIG. 9 to advance between operational steps, the bottom trace comparing outputs at logical zero and one, resulting from different present-unknown resistance states of the MTJ element.

Figure 11:
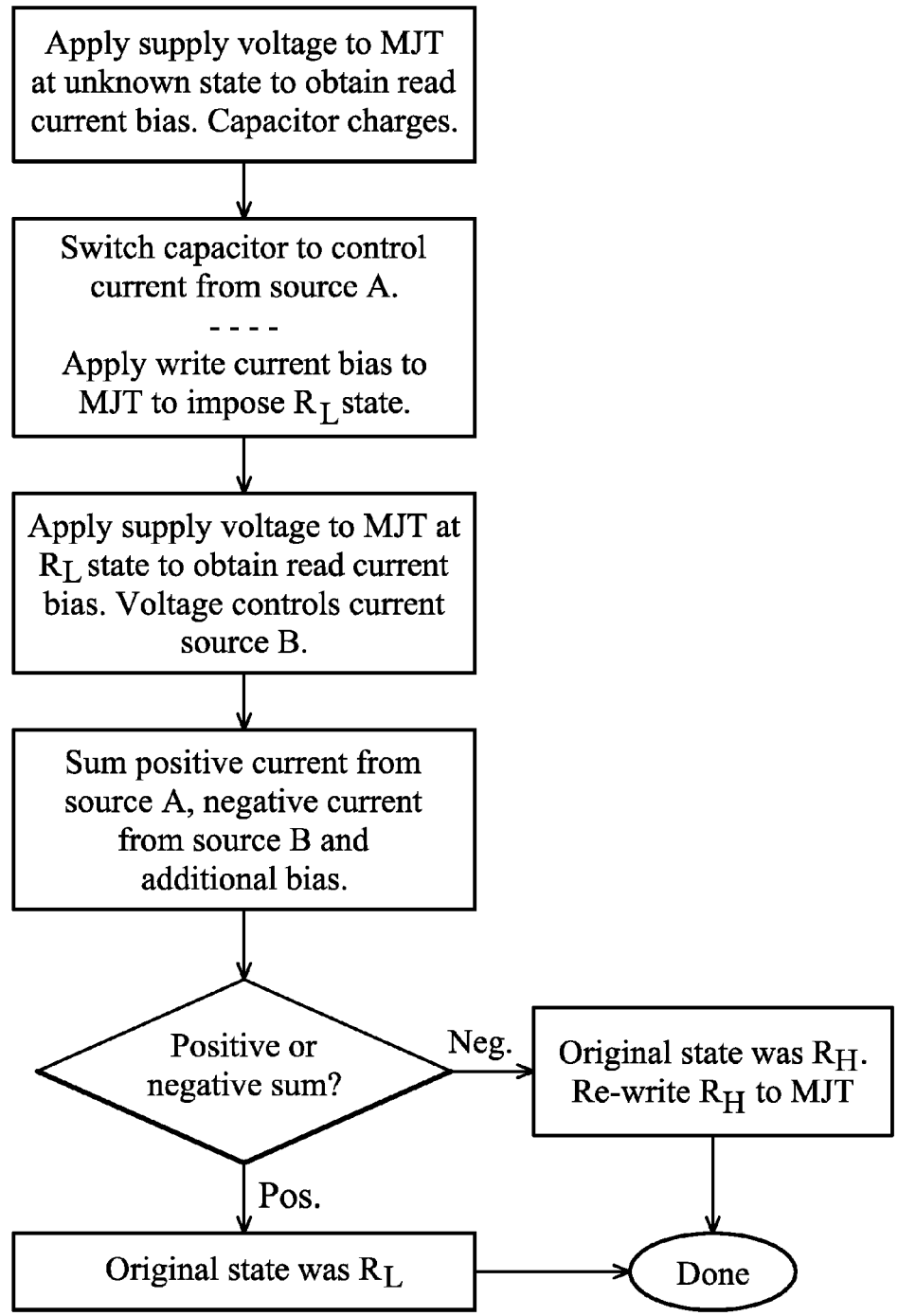

FIG. 11 is a flowchart describing the operational steps of the configurations of FIGS. 7-10.

DETAILED DESCRIPTION

Figure 1:
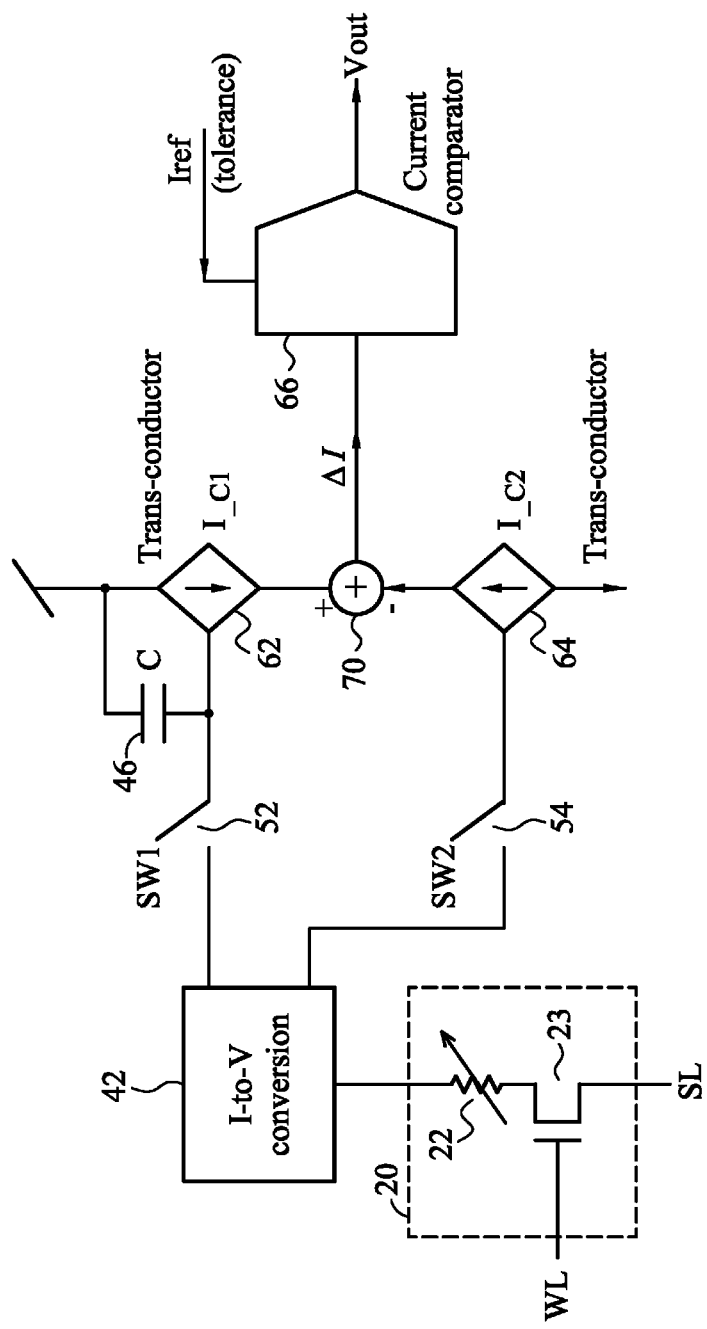

FIG. 1 is a schematic diagram showing a self-referenced read circuit for determining the resistance state of a magnetic terminal junction (MTJ) element in a magneto resistive random access memory (MRAM). A memory bit cell 20 using magneto resistive techniques as provided herein uses at least one magnetic tunnel junction (MTJ) element 22 for each bit cell, and optionally can use more than one MTJ element 22. In the example shown, the bit cell 20 has one MTJ element 20 and a switching transistor 23 that couples the MTJ element to a source line when the bit cell 20 is selected. A bit cell 20 in a memory array typically having thousands of bit cells in a pattern of rows (words) and columns (bits) is selected by activating word line and bit line signals, while appropriate bias conditions are also applied for effecting read or write operations.

Figure 2:
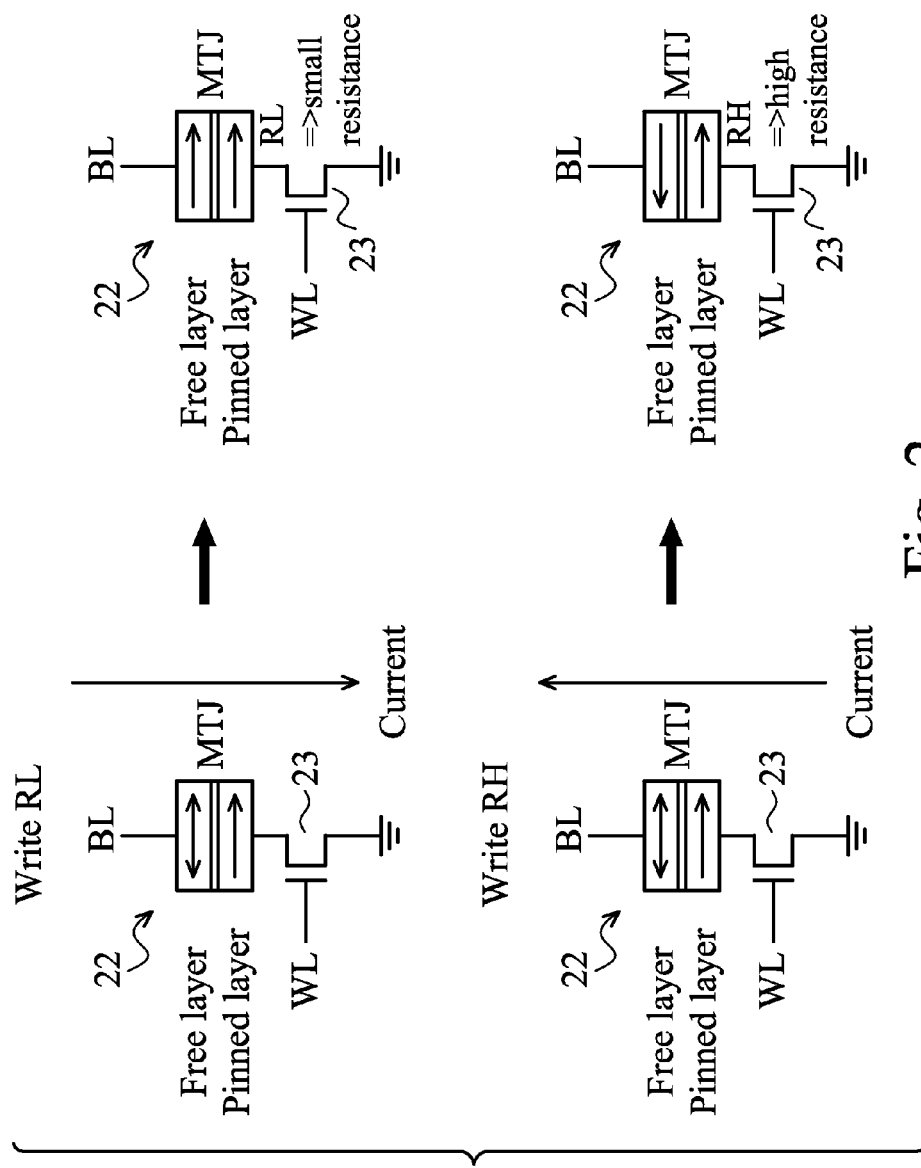
FIG. 2 is a schematic illustration showing MTJ elements in different resistance states, and showing the imposition of resistance states by application of write bias current of a given polarity.

In FIG. 1, the MTJ element 22 is shown as a variable resistance. Referring more particularly to FIG. 2, each MTJ element 22 comprises a pair of superimposed magnetic layers separated by a nonmagnetic conductive layer. One of the magnetic layers, namely the "pinned layer," as shown, has a permanent magnetic field aligned in a given direction (indicated by an arrow with one head). The other magnetic layer (the "free layer") has a changeable magnetic field alignment (indicated by an arrow with two opposite heads).

The electrical resistance of the superimposed layers (namely the series resistance through the pinned, conductive and free layers) is different when the magnetic fields of the free and pinned layers are aligned with one another (parallel) versus when the magnetic fields of the free and pinned layers are opposite (anti-parallel). In a configuration with one MTJ element 22 per bit cell, the logic value of the bit cell is represented by whether the MTJ element 22 is in a state of parallel or anti-parallel field alignments. The MTJ element 22 is in a low resistance state $R_L$, when the magnetic field alignments are parallel, or in a high resistance state $R_H$ when the magnetic field orientations of the two layers are anti-parallel. The bit cell logic value is read out by sensing whether the electrical resistance of the series-coupled pinned layer, conductive layer and free layer is the state of low resistance $R_L$ or high resistance $R_H$. In other configurations (not shown), such as a redundant configuration in which bit cells have two or more MTJ elements and arrangements to keep them in opposite states, in which case the logic level is represented by $R_L-R_H$ or $R_H-R_L$ states of the two MTJ elements in a bit cell. Either or both MTJ elements may be sensed as in the $R_L$ or $R_H$ states to read out the logic value in such a configuration.

A read operation may be accomplished by passing a known current amplitude through an MTJ element 22 and testing for a high or low potential difference, respectively indicating a high or low resistance state. Or a read operation may be accomplished by applying a known voltage amplitude and testing whether the current conducted through the MTJ element is at high or low amplitude, respectively indicating a low or high resistance state.

For write operations, the magnetic field alignment of the free layer can be forced into parallel or anti-parallel alignment with the pinned layer. One technique is to apply an external magnetic field to align the field in the free layer. Another technique, knows as spin-transfer torque, comprises passing a sufficient amplitude of current through the MTJ element 22 at one of two opposite current polarities, to force the free layer into one of two opposite alignments. In FIG. 2, a positive current polarity at the upper left moves electrons through the pinned layer toward the free layer. In the pinned layer, the electron spins become aligned to the local field alignment in the pinned layer and if the current amplitude is sufficient, the pinned layer alignment is carried into the free layer, rendering the alignments of the two layers parallel as shown in the upper right of FIG. 2, which is the state of low resistance $R_L$. A negative current of sufficient amplitude, represented by the lower left of FIG. 2, carries electrons with random spin alignment through the free layer, removing any existing alignment. The field of the adjacent pinned layer, which effectively comprises a permanent magnet, induces an anti-parallel alignment in the free layer, which is the state of high resistance $R_H$.

Figure 3:
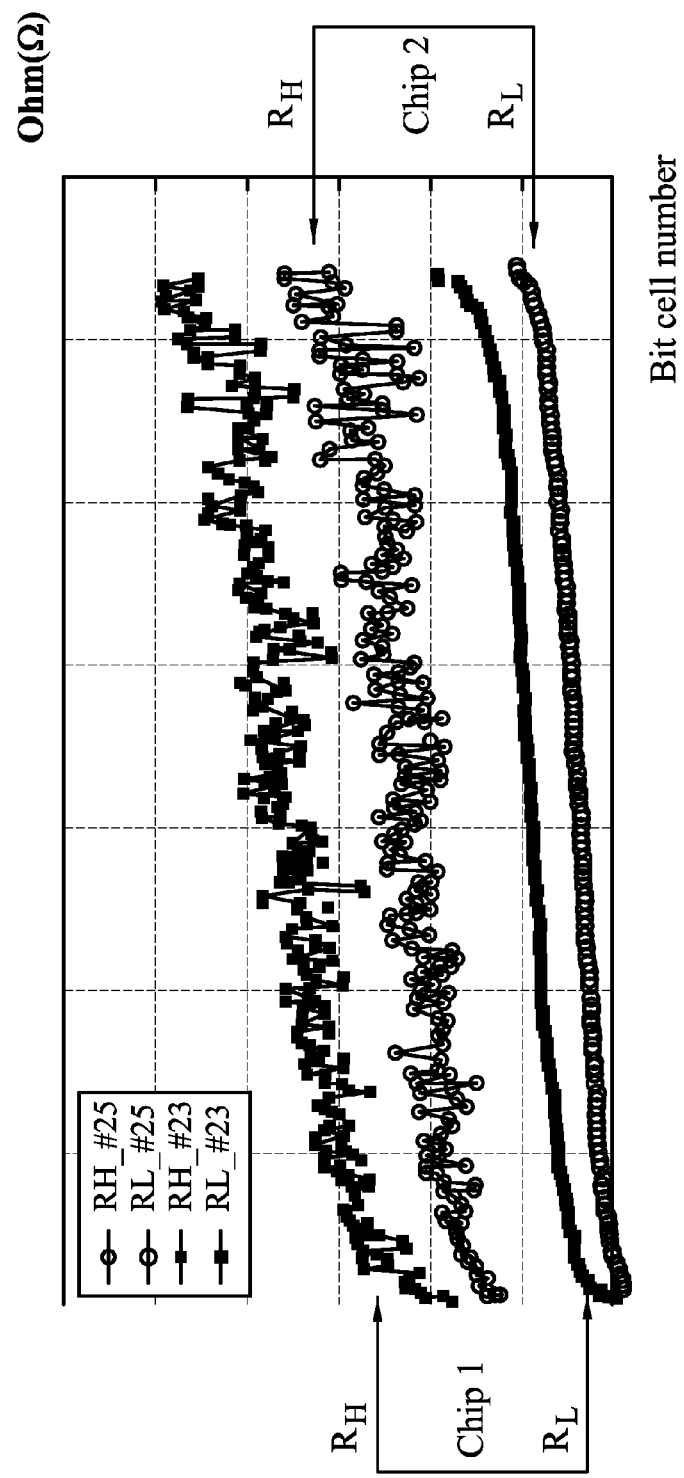
FIG. 3 is plot showing the high and low resistance values of MTJ elements of bit cells along a bit line, for two different MRAM circuit chips. The plot shows an offset between the two chips, but $R_H$ and $R_L$ values that tend to track one another.
Figure 4:
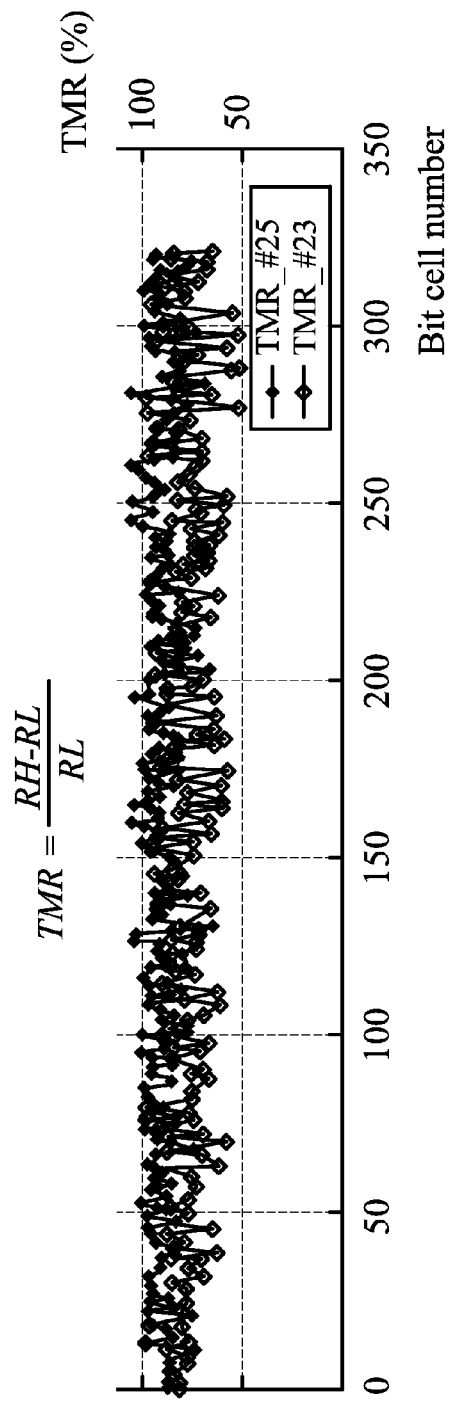
FIG. 4 is a plot of the ratio of $R_H/R_L$ for bit cells as in FIG. 3, showing that the ratio is relatively constant but for variations among bit cells on a level comparable to the distribution of $R_H$ values.

One way to determine whether an MTJ element 22 is in its high or low resistance state is to apply one of a known current or known voltage, then sense the other of current or voltage (which varies with the resistance of the MTJ element according to Ohm's Law, V=IR), and to judge by comparison techniques whether the resulting voltage across the element is higher or lower than a threshold that is expected to be somewhere between the high and low resistance states, for example, as being halfway between what is expected in the high and low resistance states. Referring to FIGS. 3-6, there are challenges according to that technique because the $R_H$ and $R_L$ resistances of the MTJ elements 22 on a chip vary substantially. In FIG. 3, the $R_L$ and $R_H$ resistances of two chips fall into distinct ranges, vary upwardly with bit cell address (for example due to conductor length variations), and are characterized by greater variation in $R_H$ than in $R_L$. In FIG. 4, the ratio of $R_L/R_H$ for the two chips is similar but has a spread that resembles the spread of the $R_H$ values.

FIG. 5 is a histogram showing an exemplary distribution of $R_L$ and $R_H$ values over a population of MTJ elements 22, consistent with the plots of resistance in FIG. 3. There are two distinct peaks for the populations of $R_H$ and $R_L$, wherein the distribution of $R_H$ is wider than that of $R_L$. It is problematic that the populations of $R_H$ and $R_L$ overlap. There are some values of $R_L$ that are higher than some values of $R_H$ and vice versa.

FIG. 6 (labeled as prior art) shows an example of a simple comparison circuit. For a given bit line BL, a reference resistance circuit containing a reference cell 35 representing a resistance for comparison, is coupled in parallel with the bit cell 20 including MTJ element 22, and the parallel legs are supplied from a common voltage/current supply through NMOS current load balancing transistors 32. When the bit cell 20 is selected by bit line and word line signals BL, WL and the source line SL provides a current bias, the output voltage $V_{out}$ has a different level depending on whether $I_{ref}$ or $I_{cell}$ has a greater or lower amplitude, indicating that the resistance of MTJ clement 22 is at $R_L$ or $R_H$ resistance state.

If one attempts to choose any specific reference resistance as a threshold comparison value for the reference cell, some of the MTJ elements will not be correctly readable because their low resistance $R_L$ will be higher than the threshold or their high resistance $R_H$ will be lower than the threshold. One cannot safely or dependably establish a comparison reference that is greater than the low resistance and less than the high resistance of all the elements to be read. On the other hand, FIG. 3 shows that although the $R_H$ and $R_L$ resistance populations overlap over a chip, the high resistance $R_H$ of a given MTJ element 22 is dependably higher than the low resistance $R_L$ of that same MTJ element. What is needed, and provided according to this disclosure, is an efficient and dependable way to compare the low and high resistances $R_L$ and $R_H$ of the MTJ element 22 of an addressed bit cell 20.

Instead of comparing the resistance of elements to a fixed threshold to discern a logic state as in FIG. 6, it is an aspect of this disclosure to provide circuits and techniques by which the resistances of magnetic tunnel junction elements 22 are self-compared. This can be accomplished by storing a measure related to the resistance of an MTJ element 22 having an unknown state, then imposing a known state, and determining whether the resistance in the known state is higher or lower than the resistance in the unknown state.

Although the parameter of primary interest is the series resistance of the MTJ element 22, it should be appreciated that there are various ways to represent differences in resistance using voltages or currents. For example, a known voltage applied to an MTJ element will produce a variable current with variations in resistance ($R_L$ or $R_H$). A known current bias likewise will produce variations in voltage across the MTJ with difference in resistances. An indirect variable may also be arranged to reflect a difference in resistance. Where an MTJ element 22 is coupled in series with another element between a current source line and a power supply voltage, the MTJ element and the other element form a voltage divider and the voltage across the other element is likewise affected by differences in the resistance of the MTJ element.

In an embodiment shown generally in FIG. 1 and more specifically in FIGS. 7-9, a measure of the unknown state is stored is a voltage level representing the unknown low or high resistance states $R_L$ or $R_H$. The known state that is imposed advantageously can be the low resistance state $R_L$, which as shown in FIG. 3, is relatively stable over the bit cells in a given chip. The stored voltage level is used as a control parameter for a variable current source supplying a current representing the unknown state. The current representing the unknown state is balanced at a summing node against the current supplied to the same MTJ element 22 in the known state, using positive and negative polarity currents to represent the known and unknown resistances of the MTJ element 22 before and after switching into the known resistance state, preferably the low resistance state $R_L$.

Referring to FIG. 1, a capacitor 46 is provided between supply source $V_S$ and an I-to-V conversion element 42 in series with the MTJ element 22. The I-to-V conversion element provides a voltage difference with current. (In one example, the element 42 can be a transistor operated in a region of proportionate conduction.) The apparatus operates in a sequence of operations based on the opening and closing of two switches 52, 54, which successively determine and store a measure of the unknown resistance in an operational condition of MTJ element 22; and after a low resistance state has been written to MTJ element 22 establish a similar operational condition for MTJ element 22 in the low resistance state. While in the unknown and low resistance states, currents $I_{\_C1}$ and $I_{\_C2}$ are produced as indirect representations of the resistance of MTJ element 22 in the unknown and low resistance states. Currents $I_{\_C1}$ and $I_{\_C2}$ are then compared, in particular by summing at node 70 their amplitudes with opposite polarity (i.e., subtracting one from the other). This produces a composite current value $\Delta I$, the amplitude of which determines whether the resistance of MTJ element 22 was greater in the unknown state or not.

Advantageously, the level of output current $\Delta I$ (namely $I_{\_C1}$ minus $I_{\_C2}$) is subjected to a threshold comparison by current comparator 66 that is configured with a sensitivity or minimum difference threshold. The function of current comparator 66 is to produce a minimum current difference $\Delta I$ as a bias that must be exceeded to provide a true output Vout, when the prior state was $R_H$, the higher resistance state. The bias $\Delta I$ is an offset by which currents $I_{\_C1}$ and $I_{\_C2}$ must differ before the output is operated to indicate that the unknown state was the high resistance state. If current Currents $I_{\_C1}$ and $I_{\_C2}$ are nearly equal within a reference tolerance determined by input Iref to current comparator 66, the unknown state was a low resistance state. Current comparator prevents a small difference between currents $I_{\_C1}$ and $I_{\_C2}$ caused by measurement error from being regarded as a difference in resistance state.

The apparatus operates in states or phases that can be advanced from one step to the next using a phase counter (not shown in FIG. 1) to switch into each phase of operation. In a first phase of a sequence for read operations, switch SW1 is closed and current from the supply is conducted through the MTJ element 22 addressed via transistor 23 by word line and source (bit line) signals WL and SL. The capacitor 46 associated with a transconductor element 62 charges to a voltage that will represent the unknown state of the MTJ element 22 that is being read. During this phase, the unknown level is also represented by a current level $I_{\_C1}$, established, coupled into a summing node 70 and thereafter maintained under control of the voltage across capacitor 46.

In a next phase, switch SW1 is opened and a write bias current is applied to the MTJ element 22 of sufficient amplitude to force the MTJ element 22 into a low resistance state (i.e., a magnetic field alignment is imposed onto the free layer, parallel to that of the pinned layer). This is a current that is more positive at the free layer, for conducting spin-polarized electrons from the pinned layer into the free layer and imposing a field alignment in the free layer that is parallel to the alignment of the pinned layer. It is also possible to impose a low resistance state by imposing a parallel field alignment on the free layer by techniques other than spin transfer torque techniques mentioned with respect to FIG. 2, for example by electromagnetically applying a field to the free layer.

In a further phase, switch SW2 is closed and the MTJ element 22 is read again, now being known to be in the low resistance state. Current $I_{\_C2}$ is generated by transconductor 64. The current $\Delta I$, namely $I_{\_C1}$ minus $I_{\_C2}$, is coupled to current comparator 66. Provided that current $\Delta I$, exceeds a minimum threshold Iref, which determines a measurement tolerance or error, the output Vout is switched true. This indicates that the MTJ was initially in the high resistance state. After shifting the output into a register or the like (not shown), the original high resistance state can be written back to the MTJ element 22 using a write bias current of the correct polarity as shown in FIG. 2, and at least a minimum amplitude. If the output Vout has not been switched on, the unknown initial state was the low resistance state, and after shifting the output into the register, no further action is required.

A measure of the resistance in an unknown state is stored and used for comparison before and after switching that bit cell in a read operation. A functional schematic diagram is shown in FIG. 1. Embodiments are disclosed in which the resistances of a same magnetic tunnel junction element (MTJ) are measured before and after imposing a low resistance state, and the two resistances are compared. Before the reading process, the resistance state of the MTJ is unknown.

When writing an arbitrary value to an MTJ element, its resistance might increase or decrease or remain the same.

FIGS. 7 and 8 demonstrate particular embodiments that detail transconductance circuits that can be used. In the disclosed embodiments, the transconductance circuits operate as voltage controlled current sources. A measure of the resistance of an MTJ element 22 in its unknown resistance state is stored, for example by charging capacitor 46 to a voltage produced by the MTJ element 22 or related to the voltage or current at the MTJ element 22, when read current bias is applied in the unknown resistance state. Then the MTJ element is written into its low resistance state (which might or might not involve a change). Read current bias is applied again to develop another voltage, similarly representing the operation of the MTJ element but known to be in low resistance state.

In FIG. 7, the same reference numbers are used to identify certain elements with counterparts in FIG. 1. A comparison circuit using current summing at node 70 and an offset providing a minimum difference tolerance (in this case the threshold of tolerance is Iref2−Iref1) determines whether the resistance of the element was reduced after the write operation or remained the same. This determines the logic state of the element. The difference in resistance is required to exceed a minimum difference threshold that is at least slightly greater than the tolerance of measurement. Successive readings with a difference due only to measurement tolerance, are not found to represent a difference in logic state.

In FIG. 7, the I-to-V conversion element (42 in FIG. 1) is represented by a PMOS transistor 65 that functions as a resistance until switch SW1 is closed, thereby charging C1 capacitor 46 and causing PMOS transistor 67 to conduct through NMOS transistor 69 to ground, at an amplitude determined by the voltage on C1 capacitor 46. If the MTJ resistance was relatively low, the voltage across C1 capacitor 46 is relatively greater, the voltage on the gate of PMOS transistor 67 is lower, and more current is conducted through PMOS transistor 67 and NMOS transistor 69. Thus, transistors 67, 69 by current $I_{\_C1}$ conduct at an amplitude that is a measure of the current through the MTJ element 22 in the unknown resistance state. The transconductor 64 at the NMOS output transistor 71 coupled to node 70 conducts away from node 70 a current amplitude that will mirror that current measure $I_{\_C1}$, provided that current is available from the other transconductance element 62 comprising a PMOS transistor 73 that adds current into node 70. The output current ΔI is the amplitude by which $I_{\_C2}$ exceeds $I_{\_C1}$.

In FIG. 7, the output current comparator corresponding to element 66 in FIG. 1 is also a summing node 8, having a current input Iref2 and a current output Iref1. Current Iref1 is kept slightly greater in amplitude than current Iref2, so that the output ΔI from node 70 must be at least slightly greater then Iref2−Iref1, in order for the output Vout to become true (positive). Preferably, the difference between Iref2 and Iref1 is made to represent a sufficient tolerance error that successive readings of the resistance state of MTJ element 22 cannot produce a positive output of Vout unless the state of the MTJ element 22 has indeed changed. The current tolerance determined by the difference between Iref1 and Iref2 advantageously is set at a current that corresponds to a difference in resistance only slightly less than the worst case least difference between $R_H$ and $R_L$ among all the members of the MTJ population. For the spread of $R_H$ and $R_L$ values in FIG. 3, a tolerance of about 50 to 100Ω could be selected because there are examples wherein the difference of $R_H$ and $R_L$ for a given bit cell is less than about 150Ω.

FIG. 8 shows an exemplary current generator for providing two currents Iref1 and Iref2, wherein Iref1>Iref2, provided that current is available at node 80. This circuit comprises pairs of series-coupled PMOS and NMOS transistors 83 and 84 or 85 and 86 that follow one another but for an offsetting resistance R_offset. The bias configuration is such that Iref2>Iref2 if current is available, namely from current ΔI from node 70 as discussed above.

FIG. 7 generally shows a phase counter 102 that sequentially controls switches 52, 54 (SW1 and SW2). The phase counter 102 can comprise a binary counter and set of gates (not shown) that cycles synchronously but at a higher frequency than a system clock controlling read and write memory operations.

FIG. 9 shows a practical embodiment of the circuits shown more schematically in FIGS. 1, 7 and 8. In this configuration, the switches are embodied as transistors responsive to the phase inputs. The phase counter is not shown. FIG. 10 illustrates the timing of exemplary phase inputs that control the timing of opening and closing of the switches 52, 54 and the reading of the output from Vout. A write interval signal is shown with two pulses, the latter for writing a low resistance state into the MTJ element 22. Phase 1 closes and opens switch SW1; phase 2 closes switch SW2; and phase 3 triggers reading of the output on Vout. Two cycles are shown in FIG. 10, resulting in different output values representing data or logic values zero and one.

In accordance with the foregoing description, a self-referenced read circuit is provided for determining an initially unknown value stored in an MRAM bit cell 20. The bit cell has at least one magnetic tunnel junction (MTJ) element 22 with a pinned layer establishing a permanent magnetic field reference direction, and a free layer with a changeable magnetic field component that is selectively alignable parallel to the reference direction in a low resistance state of the magnetic tunnel junction element, and anti-parallel to the reference direction in a high resistance state of the MTJ element. A current bias source and a switching circuit ($V_S$, transistor 65, addressing transistor 23 in FIG. 7) are coupled to apply a read current bias to the magnetic tunnel junction element 22, thereby establishing current amplitude $I_{MTJ}$ and a potential difference $V_{MTJ}$ while the MTJ element 22 is in its unknown resistance state. That state is reflected by one or both of the current amplitude $I_{MTJ}$ and a potential difference $V_{MTJ}$.

During a read operation, a storage element, such as capacitor C1 in FIG. 7, responds to a read signal to couple and store a value representing the unknown resistance state, such as the voltage across transistor 65 in FIG. 7, which is substantially equal to the supply voltage $V_S$ less the potential difference $V_{MTJ}$ across the MTJ element 22. This stored value is used to generate a current for comparison with a current that is generated during another read operation after the MTJ element 22 has been written into a known resistance state, such as the $R_L$ low resistance state in the embodiments described. Therefore, a write circuit is configured to impose one of the resistance states on the magnetic tunnel junction element, such as the $R_L$ low resistance state, after operation of the storage circuit to store said value. The switching circuits SW1, SW2 sequentially couple the magnetic tunnel junction element to the current bias source to establish the conditions representing the unknown resistance state, and then to establish current amplitude and potential difference conditions representing the imposed one of the resistance states, such as the $R_L$ state. The stored value ΔV1 and a related value $V_{MTJ}$ in the low resistance state are coupled to respective current sources representing transconductance current controls 64 (transistors 67, 69, 71) and 62 (transistor 73).

A current summing node 70 produces a sum ΔI representing a current level $I_{C1}$ added as a function of resistance of the MTJ element 22 in one of the unknown and the imposed states, with a current level $I_{C2}$ that is subtracted at the node 70 as a function of resistance of the MTJ element 22 in the other of the unknown state and the imposed state. An output circuit such as current comparator 66 is responsive to the sum, and identifies whether the unknown state and the imposed state were the same or different, namely at signal Vout.

The resistance stated imposed on the magnetic tunnel junction element by the write circuit advantageously is the low resistance state $R_L$, but embodiments are possible wherein the high resistance state is imposed. The low resistance state is preferred as the basis for comparison because it is typically more stable than the high resistance state.

In the illustrated embodiments, two transconductance circuits 62, 64 are respectively responsive to the storage element C1 for producing current representing the unknown state, and responsive directly to the magnetic tunnel junction element MTJ 22 for producing current representing the imposed resistance state. The transconductances 62, 64 respectively provide opposite polarity currents $I_{C2}$ and $I_{C1}$ into and out of the current summing node 70.

It is advantageous if the difference in resistances detected in the unknown resistance state and the imposed resistance state has a minimum difference, so as to prevent false detection of a change of state when the measured difference may be positive but small (e.g., when the unknown state was the low resistance state but the stored measurement proved to show a slightly lower resistance than the imposed $R_L$, state resistance). For this purpose, the output circuit can a current threshold comparator 66, providing a true output when current from the summing node exceeds a minimum current Iref.

In an embodiment, two opposite polarity current sources Iref1 and Iref2 are coupled to the current threshold comparator 66, 80 together with the current ΔI from the summing node 70. The current threshold of the comparator, namely the minimum difference required to conclude that the unknown state was $R_H$, is determined at least partly by a difference in amplitude of the opposite polarity current sources (Iref2 less Iref1).

In the nonlimiting examples of FIGS. 1 and 7, the storage element that holds a measure of the unknown initial resistance state of the MTJ element comprises a capacitor C1 that is charged to a voltage related to a difference between a supply voltage $V_S$ and a potential difference $V_{MTJ}$ across the magnetic tunnel junction element in the unknown resistance state of the magnetic tunnel junction element 22. This is convenient where the current supplies are voltage controlled current sources such as the discloses transconductance elements 62, 64.

Operation of the circuit requires distinct phases. Beginning with a state or phase in which a read bias current source is coupled to the MTJ element 22, a switch SW1 is operated in the next phase to load a measure of the unknown state into the storage element (such as charging C1 capacitor 46 to voltages ΔV1). The switch is decoupled and the stored measure is made available to operate a current source 64 representing the resistance of the MTJ element in the unknown state. In a further phase, write bias current is applied to the MTJ element 22 at the polarity and at the amplitude needed to impose a low resistance state $R_L$, on the MTJ element 22. Next, a switch is operated to couple read current bias to the MTJ element 22 and a measure of the known state, which can optionally be the same measure as was stored for the unknown state, can be read to control a second current source 62. At that point, a comparison is possible. If the outcome indicates that the unknown resistance state was $R_H$, a further write operation can write that state back to the MTJ element 22. These operations occur sequentially, for example under control of a phase counter 102, provided to control the switching circuit for sequentially coupling the magnetic tunnel junction element to the current bias source to establish the conditions representing the unknown resistance state, and then to establish current amplitude and potential difference conditions representing the imposed one of the resistance states.

The subject matter can be regarded as a method as well as an apparatus. FIG. 11 demonstrates the steps involved, using a flowchart format. The method is for reading out an unknown logic state of an MRAM bit cell 20 having at least one magnetic tunnel junction element 22 with a pinned layer establishing a permanent magnetic field reference direction, and a free layer with a changeable magnetic field component that is selectively alignable parallel to the reference direction in a low resistance state of the magnetic tunnel junction element, and anti-parallel to the reference direction in a high resistance state of said element. The magnetic tunnel junction element 22 is coupled to a current bias source $V_S$ so as to provide a predetermined amplitude of one of voltage and current. This establishes a current amplitude in the magnetic tunnel junction element MTJ 22 and/or a potential difference across the MTJ 22 that represent a resistance of the MTJ 22 in an unknown one of the low and high resistance states $R_H$ or $R_L$. A measure of one of the current amplitude and the potential difference is stored in a storage device. Then a known resistance state such as $R_L$ is imposed on the MTJ 22 in a write operation, i.e., by applying a write current of sufficient amplitude and correct polarity to force magnetic field alignment of the free layer to parallel with the alignment of the pinned layer. Two measurement signals $I_{C1}$ $I_{C2}$ and are generated, respectively related to the resistances of the magnetic tunnel junction element in the unknown state and in the imposed known resistance state. These signals are compared. In the case of current signals, positive and negative measurement signals can be added at a summing node. Voltage signals can be coupled to inverting and non-inverting inputs of an amplifier. The signals can be used to set the state of a latch. In any event, a logic value is established and can be signaled as an output. Preferably the difference must be such that the unknown state measurement is different than the known state measurement by an amount that is greater than a predetermined measurement tolerance, so that successive readings of a same resistance state (e.g., unknown and imposed states that are both $R_L$) cannot inadvertently produce an output indicating that the unknown state was different.

The resistance state imposed on the magnetic tunnel junction element is advantageously a low resistance state. The two measurement signals can comprise current signals produced by transconductance circuits having outputs coupled to a current summing node. The transconductance circuits can respond to the potential difference across the magnetic tunnel junction element 22, i.e., functioning as voltage controlled current sources. The potential difference across the magnetic tunnel junction can be derived directly from the MTJ in one of the unknown and imposed states, and storing a measure of the potential difference in the other of the unknown and imposed states. The potential difference in one or both states can be the potential difference across the MTJ element 22 or a potential difference across another element (e.g., transistor 65) that varies in a manner that is related to the resistance of the MTJ element 22.

In the nonlimiting examples described to illustrate these concepts, the storing step included charging a capacitor C1 to a voltage obtained when applying the current bias to the magnetic tunnel junction in the unknown state.

In a case where it is determined that the unknown state of the MTJ element 22 was not the same as the state such as $R_L$, that was imposed during the operation, that original state can be written back to the magnetic tunnel junction element 22 after completing the read operation.

In the exemplary embodiments, the measurement signals are typically voltages but the voltages are used to control current sources and the currents produces by those sources are compared. This can be accomplished by coupling positive and negative current sources to a summing node and the output is indicate by the positive or negative voltage polarity (i.e., the availability of output current) from the summing node. However as discussed, it is advantageous if it is further determined that a sum outputs from the current sources, e.g., the outputs of opposite polarity transconductance current sources, is different by at least a minimum threshold difference representing an approximate tolerance in successive measurements wherein the magnetic tunnel junction remains in a same resistance state. Note that this threshold is not a matter of comparing the resistance of an MTJ element to a threshold. It is a matter of ensuring that a detected difference between the before-and-after resistances of an MTJ element initially in an unknown state, after imposing a known state, is at least sufficient in a self-referenced comparison of $R_L$ to $R_H$ or $R_H$ to $R_L$, for that same MTJ element, to conclude with confidence that the resistance state of the MTJ element has indeed changed.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A self-referenced read circuit for determining an initially unknown value stored in an MRAM bit cell, the bit cell having a magnetic tunnel junction element with a pinned layer establishing a permanent magnetic field reference direction, and a free layer with a changeable magnetic field component that is selectively alignable parallel to the reference direction in a low resistance state of the magnetic tunnel junction element, and anti-parallel to the reference direction in a high resistance state of said element, the self-referenced reading circuit comprising:

a current bias source and a switching circuit coupled to apply a read current bias to the magnetic tunnel junction element, thereby establishing current amplitude and potential difference conditions representing the unknown resistance state;

a storage element responsive to the read circuit, operable for storing a value representing the unknown resistance state;

a write circuit operable to impose one of the resistance states on the magnetic tunnel junction element after operation of the storage circuit to store said value;

wherein the switching circuit sequentially couples the magnetic tunnel junction element to the current bias source to establish the conditions representing the unknown resistance state, and then to establish current amplitude and potential difference conditions representing the imposed one of the resistance states;

a current summing node operable to produce a sum of a current level increased with resistance in one of the unknown state and the imposed state, with a current level decreased with resistance in the other of the unknown state and the imposed state; and, an output circuit responsive to the sum, identifying whether the unknown state and the imposed state were the same or different.

2. The self-referenced read circuit of claim 1, wherein the resistance stated imposed on the magnetic tunnel junction element by the write circuit is a low resistance state.

3. The self-referenced read circuit of claim 1, further comprising two transconductance circuits, respectively responsive to the storage element for producing current representing the unknown state and to the magnetic tunnel junction element for producing current representing the imposed resistance state.

4. The self-referenced read circuit of claim 1, wherein the transconductance respectively provide opposite polarity currents to the current summing node, and wherein the output circuit comprising a current threshold comparator providing a true output when current from the summing node exceeds a minimum current.

5. The self-referenced read circuit of claim 1, comprising two opposite polarity current sources coupled to the current threshold comparator together with the current from the summing node, and wherein the current threshold of the comparator is determined at least partly by a difference in amplitude of the opposite polarity current sources.

6. The self-referenced read circuit of claim 1, wherein the storage element comprises a capacitor charged to a voltage related to a difference between a supply voltage and a potential difference across the magnetic tunnel junction element in the unknown resistance state of the magnetic tunnel junction element.

7. The self-referenced read circuit of claim 6, wherein the capacitor is coupled to a first transconductance circuit for controlling an amplitude of current coupled to the current summing node based upon the voltage to which the capacitor is charged.

8. The self-referenced read circuit of claim 1, further comprising a phase counter operable to control the switching circuit for sequentially coupling the magnetic tunnel junction element to the current bias source to establish the conditions representing the unknown resistance state, and then to establish current amplitude and potential difference conditions representing the imposed one of the resistance states.

9. A method for reading out an unknown logic state of an MRAM bit cell, the bit cell having a magnetic tunnel junction element with a pinned layer establishing a permanent magnetic field reference direction, and a free layer with a changeable magnetic field component that is selectively alignable parallel to the reference direction in a low resistance state of the magnetic tunnel junction element, and anti-parallel to the reference direction in a high resistance state of said element, the method comprising:

coupling the magnetic tunnel junction element to a current bias source with a predetermined amplitude of one of voltage and current, thereby establishing a current amplitude in the magnetic tunnel junction element and a potential difference that represent a resistance of the magnetic junction element in an unknown one of the low and high resistance states;

storing a measure of one of the current amplitude and the potential difference in a storage device;

imposing a known resistance state on the magnetic tunnel junction element by applying a write current of sufficient amplitude and correct polarity to force the known resistance state;

generating two measurement signals, respectively related to the resistances of the magnetic tunnel junction element in the unknown state and in the imposed known resistance state;

comparing the said positive and negative measurement signals and determining a difference;

signaling a logic value due to the unknown state being equal to the imposed state if the difference is less than a predetermined sensitivity threshold and otherwise signaling an opposite logic value.

10. The method of claim 9, wherein the resistance state imposed on the magnetic tunnel junction element is a low resistance state.

11. The method of claim 9, wherein the two measurement signals comprise current signals produced by transconductance circuits having outputs coupled to a current summing node.

12. The method of claim 9, wherein at least one of the transconductance circuits is responsive to the potential difference across the magnetic tunnel junction element.

13. The method of claim 12 comprising obtaining the potential difference across the magnetic tunnel junction directly from the MTJ in one of the unknown and imposed states, and storing a measure of the potential difference in the other of the unknown and imposed states.

14. The method of claim 13 wherein said storing step comprises charging a capacitor to a voltage obtained when applying the current bias to the magnetic tunnel junction in the unknown state.

15. The method of claim 9, further comprising writing back to the magnetic tunnel junction a resistance state representing a logic value from the comparing and signaling steps.

16. The method of claim 9, wherein the measurement signals are voltages, further comprising operating two opposite polarity transconductance current sources coupled to a current threshold comparator, and wherein said comparing comprises determining whether a sum outputs of the opposite polarity transconductance current sources exceeds a minimum difference representing an approximate tolerance in successive measurements wherein the magnetic tunnel junction remains in a same resistance state.

17. The method of claim 9, further comprising successively switching between said generating and comparing steps under control of a phase counter.

18. An MRAM memory array comprising:

a plurality of bit cells for storing logic states, each bit cell having at least one magnetic tunnel junction element with a pinned layer establishing a permanent magnetic field reference direction, and a free layer with a changeable magnetic field component that is selectively alignable parallel to the reference direction in a low resistance state of the magnetic tunnel junction element, and anti-parallel to the reference direction in a high resistance state of said element;

at least one current bias source in a self-referenced read circuit for determining an unknown value stored in the bit cell;

wherein a switching circuit is coupled to apply a read current bias to the magnetic tunnel junction element, thereby establishing current amplitude and potential difference conditions representing the unknown resistance state;

wherein a storage element is responsive to the read circuit, and comprises at least one capacitor operable for storing a voltage representing the unknown resistance state;

wherein a write circuit is operable to impose a low resistance state on the magnetic tunnel junction element after operation of the storage circuit to store said voltage;

wherein the switching circuit sequentially couples the magnetic tunnel junction element to the current bias source to establish the conditions representing the unknown resistance state, whereupon the storage and then to establish current amplitude and potential difference conditions representing the imposed one of the resistance states, and then coupled the magnetic tunnel junction to the current bias source in the low resistance state;

wherein the voltage stored by the capacitor in the unknown resistance state and a corresponding voltage developed when operation the magnetic tunnel junction in the low resistance state are coupled to transconductance circuits that respectively add and sink currents to a current summing node; and, wherein the summing node is coupled to a current comparator having a minimum difference offset, the current comparator having an output representing the logic state of the bit cell.

* * * * *